(12) United States Patent
Chen et al.

(10) Patent No.: US 11,837,680 B2
(45) Date of Patent: Dec. 5, 2023

(54) SUBSTRATE STRUCTURING METHODS

(71) Applicant: Applied Materials, Inc., Santa Clara, CA (US)

(72) Inventors: Han-Wen Chen, Cupertino, CA (US); Steven Verhaverbeke, San Francisco, CA (US); Giback Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/747,408

(22) Filed: May 18, 2022

(65) Prior Publication Data
US 2022/0278248 A1 Sep. 1, 2022

Related U.S. Application Data

(63) Continuation of application No. 17/227,763, filed on Apr. 12, 2021, now Pat. No. 11,362,235, which is a
(Continued)

(30) Foreign Application Priority Data

May 10, 2019 (IT) .......................... 102019000006740

(51) Int. Cl.
*H01L 31/18* (2006.01)
*H01L 21/027* (2006.01)
(Continued)

(52) U.S. Cl.
CPC ...... *H01L 31/1804* (2013.01); *H01L 21/0275* (2013.01); *H01L 21/3046* (2013.01);
(Continued)

(58) Field of Classification Search
CPC ............. H01L 31/1804; H01L 21/0275; H01L 21/3046; H01L 21/30621; H01L 21/3086;
(Continued)

(56) References Cited

U.S. PATENT DOCUMENTS 4,073,610 A * 2/1978 Cox .................... B29C 45/5675
425/577
5,268,194 A * 12/1993 Kawakami ........... H05K 3/4053
427/98.2
(Continued)

FOREIGN PATENT DOCUMENTS

CN 102024713 A * 4/2011 ........... H01L 21/561
DE 202014103794 U1 * 12/2014 ......... H01L 23/5381
(Continued)

OTHER PUBLICATIONS

Japanese Office Action dated Jan. 31, 2023, for Japanese Patent Application No. 2021-566586.
(Continued)

*Primary Examiner* — Earl N Taylor
(74) *Attorney, Agent, or Firm* — Patterson + Sheridan, LLP

(57) ABSTRACT

The present disclosure relates to methods and apparatus for structuring a semiconductor substrate. In one embodiment, a method of substrate structuring includes applying a resist layer to a substrate optionally disposed on a carrier. The resist layer is patterned using ultraviolet radiation or laser ablation. The patterned portions of the resist layer are then transferred onto the substrate by micro-blasting to form desired features in the substrate while unexposed or un-ablated portions of the resist layer shield the rest of the substrate. The substrate is then exposed to an etch process and a de-bonding process to remove the resist layer and release the carrier.

20 Claims, 6 Drawing Sheets

Related U.S. Application Data continuation of application No. 16/687,564, filed on Nov. 18, 2019, now Pat. No. 11,063,169.

(51) Int. Cl.
*H01L 21/304* (2006.01)
*H01L 21/768* (2006.01)
*H01L 21/308* (2006.01)
*H01L 21/306* (2006.01)
*H01L 21/48* (2006.01)
*H01L 23/498* (2006.01)
*H01L 21/683* (2006.01)

(52) U.S. Cl.
CPC .... *H01L 21/3086* (2013.01); *H01L 21/30621* (2013.01); *H01L 21/486* (2013.01); *H01L 21/6835* (2013.01); *H01L 21/76898* (2013.01); *H01L 23/49827* (2013.01); *H01L 31/1892* (2013.01); *H01L 2221/68345* (2013.01); *Y02E 10/547* (2013.01)

(58) Field of Classification Search
CPC .............. H01L 21/486; H01L 21/6835; H01L 21/76898; H01L 23/49827; H01L 31/1892; H01L 2221/68345; Y02E 10/547
See application file for complete search history.

(56) References Cited

U.S. PATENT DOCUMENTS

| | | | | |
|---|---|---|---|---|
| 5,353,195 A * | 10/1994 | Fillion | .................... | H01L 24/82 257/E23.079 |
| 5,374,788 A * | 12/1994 | Endoh | .................... | H05K 1/056 174/257 |
| 5,474,834 A * | 12/1995 | Tanahashi | ......... | H01L 23/49888 428/688 |
| 5,670,262 A * | 9/1997 | Dalman | ................. | C08G 73/22 428/209 |
| 5,767,480 A * | 6/1998 | Anglin | ................ | H01L 21/4821 29/827 |
| 5,783,870 A * | 7/1998 | Mostafazadeh | ....... | H01L 25/105 361/764 |
| 5,841,102 A * | 11/1998 | Noddin | ................ | H01L 21/486 219/121.61 |
| 5,868,950 A * | 2/1999 | Noddin | ................ | H05K 3/0026 428/209 |
| 5,871,393 A * | 2/1999 | Shiozawa | ............... | B24B 45/00 451/286 |
| 5,878,485 A * | 3/1999 | Wood | ................. | G01R 31/2893 257/E23.07 |
| 6,013,948 A * | 1/2000 | Akram | .............. | H01L 23/49883 257/737 |
| 6,039,889 A * | 3/2000 | Zhang | .................... | H05K 3/427 216/13 |
| 6,087,719 A * | 7/2000 | Tsunashima | ............ | H01L 25/50 356/6 |
| 6,117,704 A * | 9/2000 | Yamaguchi | ............. | H01L 24/82 257/E21.705 |
| 6,384,473 B1 * | 5/2002 | Peterson | ........... | H01L 27/14618 257/737 |
| 6,388,202 B1 * | 5/2002 | Swirbel | ................ | H05K 3/4644 174/262 |
| 6,388,207 B1 * | 5/2002 | Figueroa | ................ | H05K 1/115 257/E23.079 |
| 6,392,290 B1 * | 5/2002 | Kasem | ................ | H01L 24/03 257/E21.597 |
| 6,459,046 B1 * | 10/2002 | Ochi | .................... | H05K 3/4069 174/262 |
| 6,465,084 B1 * | 10/2002 | Curcio | ................... | H05K 3/462 428/209 |
| 6,506,632 B1 * | 1/2003 | Cheng | ................. | H01L 21/6835 438/126 |
| 6,512,182 B2 * | 1/2003 | Takeuchi | ............... | H05K 1/185 29/841 |
| 6,555,906 B2 * | 4/2003 | Towle | .................. | H01L 21/568 257/723 |
| 6,576,869 B1 * | 6/2003 | Gower | ................. | H05K 3/0032 219/121.7 |
| 6,593,240 B1 * | 7/2003 | Page | ...................... | B24B 37/245 438/692 |
| 6,661,084 B1 * | 12/2003 | Peterson | ................. | H01L 23/10 257/737 |
| 6,677,552 B1 * | 1/2004 | Tulloch | .................. | B23K 26/40 257/E21.597 |
| 6,713,719 B1 * | 3/2004 | De Steur | ............. | H05K 3/0038 219/121.7 |
| 6,775,907 B1 * | 8/2004 | Boyko | ................... | H05K 3/381 29/846 |
| 6,781,093 B2 * | 8/2004 | Conlon | .................. | B23K 26/40 219/121.72 |
| 7,028,400 B1 * | 4/2006 | Hiner | .................... | H05K 3/4007 427/97.1 |
| 7,064,069 B2 * | 6/2006 | Draney | ............. | H01L 21/02016 257/E21.219 |
| 7,078,788 B2 * | 7/2006 | Vu | ........................... | H01L 21/56 257/691 |
| 7,091,593 B2 * | 8/2006 | Ishimaru | ............. | H01L 23/5389 257/E21.511 |
| 7,105,931 B2 * | 9/2006 | Attarwala | ............... | H01L 21/50 257/E23.101 |
| 7,129,117 B2 * | 10/2006 | Hsu | ......................... | H01L 24/82 257/E21.705 |
| 7,166,914 B2 * | 1/2007 | DiStefano | ......... | H01L 23/49827 257/E23.065 |
| 7,170,152 B2 * | 1/2007 | Huang | ................ | H01L 21/6835 257/684 |
| 7,192,807 B1 * | 3/2007 | Huemoeller | ............ | H01L 24/19 438/118 |
| 7,211,899 B2 * | 5/2007 | Taniguchi | .............. | H05K 1/115 257/E23.009 |
| 7,271,012 B2 * | 9/2007 | Anderson | .......... | B23K 26/0853 438/690 |
| 7,276,446 B2 * | 10/2007 | Robinson | ................ | B24B 37/04 438/692 |
| 7,312,405 B2 * | 12/2007 | Hsu | ........................ | H05K 1/185 174/262 |
| 7,321,164 B2 * | 1/2008 | Hsu | ........................ | H01L 24/82 257/725 |
| 7,449,363 B2 * | 11/2008 | Hsu | ..................... | H01L 23/5389 438/106 |
| 7,458,794 B2 * | 12/2008 | Schwaighofer | ......... | B29C 45/32 425/588 |
| 7,511,365 B2 * | 3/2009 | Wu | ...................... | H01L 23/3128 257/676 |
| 7,723,838 B2 * | 5/2010 | Takeuchi | .......... | H01L 23/49816 257/702 |
| 7,808,799 B2 * | 10/2010 | Kawabe | ............ | H01L 23/49822 361/728 |
| 7,839,649 B2 * | 11/2010 | Hsu | ..................... | H01L 23/5389 361/764 |
| 7,843,064 B2 * | 11/2010 | Kuo | ..................... | H01L 23/481 438/622 |
| 7,852,634 B2 * | 12/2010 | Sakamoto | ............... | H01L 24/19 361/761 |
| 7,855,460 B2 * | 12/2010 | Kuwajima | .......... | H01L 23/3192 257/773 |
| 7,868,464 B2 * | 1/2011 | Kawabata | .............. | H05K 1/0265 430/311 |
| 7,914,693 B2 * | 3/2011 | Jeong | .................. | G03F 7/0002 216/81 |
| 7,915,737 B2 * | 3/2011 | Nakasato | ............ | H01L 23/3114 257/E23.011 |
| 7,932,608 B2 * | 4/2011 | Tseng | ...................... | H01L 21/76898 257/773 |
| 7,982,305 B1 * | 7/2011 | Railkar | ................... | H01L 24/32 257/692 |
| 7,988,446 B2 * | 8/2011 | Yeh | ........................ | B29C 45/56 425/572 |

(56) References Cited

U.S. PATENT DOCUMENTS

| | | | | |
|---|---|---|---|---|
| 8,137,497 B2* | 3/2012 | Sunohara | | H01L 24/19 |
| | | | | 156/247 |
| 8,283,778 B2* | 10/2012 | Trezza | | H01L 21/6836 |
| | | | | 257/E21.597 |
| 8,314,343 B2* | 11/2012 | Inoue | | H01L 24/24 |
| | | | | 29/829 |
| 8,367,943 B2* | 2/2013 | Wu | | H05K 1/115 |
| | | | | 174/262 |
| 8,426,246 B2* | 4/2013 | Toh | | H01L 25/0657 |
| | | | | 438/109 |
| 8,476,769 B2* | 7/2013 | Chen | | H01L 21/6835 |
| | | | | 257/774 |
| 8,518,746 B2* | 8/2013 | Pagaila | | H01L 23/49816 |
| | | | | 438/618 |
| 8,536,695 B2* | 9/2013 | Liu | | A61P 37/08 |
| | | | | 174/262 |
| 8,628,383 B2* | 1/2014 | Starling | | C09K 3/1409 |
| | | | | 451/526 |
| 8,633,397 B2* | 1/2014 | Jeong | | H01L 23/5389 |
| | | | | 174/262 |
| 8,698,293 B2* | 4/2014 | Otremba | | H01L 23/5385 |
| | | | | 257/773 |
| 8,728,341 B2* | 5/2014 | Ryuzaki | | C09K 3/1409 |
| | | | | 438/692 |
| 8,772,087 B2* | 7/2014 | Barth | | H01L 23/5389 |
| | | | | 257/725 |
| 8,786,098 B2* | 7/2014 | Wang | | H01L 21/563 |
| | | | | 257/774 |
| 8,877,554 B2* | 11/2014 | Tsai | | H01L 23/49816 |
| | | | | 257/737 |
| 8,890,628 B2* | 11/2014 | Nair | | H01L 23/552 |
| | | | | 257/416 |
| 8,907,471 B2* | 12/2014 | Beyne | | H01L 23/3128 |
| | | | | 438/106 |
| 8,952,544 B2* | 2/2015 | Lin | | H01L 21/486 |
| | | | | 257/774 |
| 8,980,691 B2* | 3/2015 | Lin | | H01L 25/50 |
| | | | | 438/666 |
| 8,980,727 B1* | 3/2015 | Lei | | H01L 21/3065 |
| | | | | 438/464 |
| 8,990,754 B2* | 3/2015 | Bird | | H05K 1/113 |
| | | | | 716/124 |
| 8,994,185 B2* | 3/2015 | Lin | | H01L 23/5389 |
| | | | | 257/E23.001 |
| 8,999,759 B2* | 4/2015 | Chia | | H01L 23/5389 |
| | | | | 257/773 |
| 9,059,186 B2* | 6/2015 | Shim | | H01L 21/561 |
| 9,064,936 B2* | 6/2015 | Lin | | H01L 24/81 |
| 9,070,637 B2* | 6/2015 | Yoda | | H01L 21/76898 |
| 9,099,313 B2* | 8/2015 | Lee | | H01L 24/82 |
| 9,159,678 B2* | 10/2015 | Cheng | | H01L 23/3157 |
| 9,161,453 B2* | 10/2015 | Koyanagi | | H05K 1/185 |
| 9,210,809 B2* | 12/2015 | Mallik | | H05K 3/0029 |
| 9,224,674 B2* | 12/2015 | Malatkar | | H01L 23/481 |
| 9,275,934 B2* | 3/2016 | Sundaram | | H01L 23/562 |
| 9,355,881 B2* | 5/2016 | Goller | | H01L 21/76251 |
| 9,385,056 B2* | 7/2016 | Hu | | H01L 23/13 |
| 9,396,999 B2* | 7/2016 | Yap | | H01L 23/5384 |
| 9,499,397 B2* | 11/2016 | Bowles | | B81B 7/02 |
| 9,530,752 B2* | 12/2016 | Nikitin | | H01L 24/97 |
| 9,554,469 B2* | 1/2017 | Hurwitz | | H05K 1/0373 |
| 9,660,037 B1* | 5/2017 | Zechmann | | H01L 21/76885 |
| 9,735,134 B2* | 8/2017 | Chen | | H01L 24/82 |
| 9,748,167 B1* | 8/2017 | Lin | | H01L 24/16 |
| 9,754,849 B2* | 9/2017 | Huang | | H01L 21/486 |
| 9,837,352 B2* | 12/2017 | Chang | | H01L 23/3114 |
| 9,859,258 B2* | 1/2018 | Chen | | H01L 24/97 |
| 9,875,970 B2* | 1/2018 | Yi | | H01L 23/5384 |
| 9,887,103 B2* | 2/2018 | Scanlan | | H01L 24/97 |
| 9,887,167 B1* | 2/2018 | Lee | | H01L 21/4882 |
| 9,978,720 B2* | 5/2018 | Theuss | | H01L 23/3135 |
| 9,997,444 B2* | 6/2018 | Meyer | | H01L 23/3114 |
| 10,014,292 B2* | 7/2018 | Or-Bach | | H01L 25/117 |
| 10,037,975 B2* | 7/2018 | Hsieh | | H01L 23/28 |
| 10,051,742 B2* | 8/2018 | Yang | | H01L 23/5384 |
| 10,128,177 B2* | 11/2018 | Kamgaing | | H01L 23/5223 |
| 10,153,219 B2* | 12/2018 | Jeon | | H01L 23/5389 |
| 10,163,803 B1* | 12/2018 | Chen | | H01L 24/19 |
| 10,170,386 B2* | 1/2019 | Kang | | H01L 23/36 |
| 10,177,083 B2* | 1/2019 | Kim | | H01L 25/0655 |
| 10,211,072 B2* | 2/2019 | Chen | | H01L 21/568 |
| 10,256,180 B2* | 4/2019 | Liu | | H05K 1/181 |
| 10,269,773 B1* | 4/2019 | Yu | | H01L 24/14 |
| 10,297,518 B2* | 5/2019 | Lin | | H01L 23/293 |
| 10,297,586 B2* | 5/2019 | Or-Bach | | H01L 21/76254 |
| 10,304,765 B2* | 5/2019 | Chen | | H01L 23/49827 |
| 10,347,585 B2* | 7/2019 | Shin | | H01L 24/92 |
| 10,410,971 B2* | 9/2019 | Rae | | H01L 23/49811 |
| 10,515,912 B2* | 12/2019 | Lim | | H01L 23/49822 |
| 10,522,483 B2* | 12/2019 | Shuto | | H01L 25/117 |
| 10,553,515 B2* | 2/2020 | Chew | | H01L 25/105 |
| 10,570,257 B2* | 2/2020 | Sun | | C08G 77/50 |
| 10,658,337 B2* | 5/2020 | Yu | | H01L 23/5384 |
| 2001/0030059 A1* | 10/2001 | Sugaya | | H01L 21/56 |
| | | | | 257/E23.125 |
| 2002/0036054 A1* | 3/2002 | Nakatani | | H01L 25/0652 |
| | | | | 428/209 |
| 2002/0048715 A1* | 4/2002 | Walczynski | | G03F 7/161 |
| | | | | 430/320 |
| 2002/0070443 A1* | 6/2002 | Mu | | H01L 24/19 |
| | | | | 257/796 |
| 2002/0135058 A1* | 9/2002 | Asahi | | H05K 1/187 |
| | | | | 257/788 |
| 2002/0158334 A1* | 10/2002 | Vu | | H01L 24/24 |
| | | | | 257/723 |
| 2003/0059976 A1* | 3/2003 | Nathan | | H01L 24/82 |
| | | | | 257/E29.022 |
| 2003/0221864 A1* | 12/2003 | Bergstedt | | H05K 1/186 |
| | | | | 29/854 |
| 2003/0222330 A1* | 12/2003 | Sun | | B23K 26/043 |
| | | | | 257/E23.15 |
| 2004/0080040 A1* | 4/2004 | Dotta | | H01L 21/76898 |
| | | | | 257/784 |
| 2004/0134682 A1* | 7/2004 | En | | C25D 5/18 |
| | | | | 174/258 |
| 2004/0248412 A1* | 12/2004 | Liu | | H01L 21/3212 |
| | | | | 438/689 |
| 2005/0012217 A1* | 1/2005 | Mori | | H01L 23/49827 |
| | | | | 257/E23.062 |
| 2005/0070092 A1* | 3/2005 | Kirby | | H01L 21/76807 |
| | | | | 257/E21.597 |
| 2005/0170292 A1* | 8/2005 | Tsai | | G03F 7/0002 |
| | | | | 430/323 |
| 2006/0014532 A1* | 1/2006 | Seligmann | | H04L 63/10 |
| | | | | 455/420 |
| 2006/0073234 A1* | 4/2006 | Williams | | B29C 33/3857 |
| | | | | 264/225 |
| 2006/0128069 A1* | 6/2006 | Hsu | | H01L 24/19 |
| | | | | 438/126 |
| 2006/0145328 A1* | 7/2006 | Hsu | | H05K 1/185 |
| | | | | 257/690 |
| 2006/0270242 A1* | 11/2006 | Verhaverbeke | | C11D 3/33 |
| | | | | 134/1.2 |
| 2006/0283716 A1* | 12/2006 | Hafezi | | H01L 21/76873 |
| | | | | 257/E21.585 |
| 2007/0035033 A1* | 2/2007 | Ozguz | | H01L 21/4846 |
| | | | | 257/E21.705 |
| 2007/0077865 A1* | 4/2007 | Dysard | | C09G 1/02 |
| | | | | 451/41 |
| 2007/0111401 A1* | 5/2007 | Kataoka | | H05K 3/06 |
| | | | | 257/202 |
| 2007/0130761 A1* | 6/2007 | Kang | | H05K 3/0094 |
| | | | | 174/262 |
| 2007/0144769 A1* | 6/2007 | Salama | | H01L 23/49822 |
| | | | | 174/262 |
| 2008/0006945 A1* | 1/2008 | Lin | | H01L 24/05 |
| | | | | 257/E23.134 |
| 2008/0053971 A1* | 3/2008 | Kobayashi | | B23K 26/0853 |
| | | | | 219/121.61 |

(56) References Cited

U.S. PATENT DOCUMENTS

| | | | | |
|---|---|---|---|---|
| 2008/0064187 | A1* | 3/2008 | Brown | B23K 26/40 438/464 |
| 2008/0067157 | A1* | 3/2008 | Morikazu | B23K 26/389 257/E21.597 |
| 2008/0076256 | A1* | 3/2008 | Kawai | B23K 26/389 257/E21.597 |
| 2008/0090095 | A1* | 4/2008 | Nagata | C23C 28/023 428/626 |
| 2008/0173792 | A1* | 7/2008 | Yang | H01L 24/82 250/208.1 |
| 2008/0173999 | A1* | 7/2008 | Chung | H01L 24/19 257/E23.169 |
| 2008/0206989 | A1* | 8/2008 | Kruger | H01L 21/76898 257/E21.597 |
| 2009/0243065 | A1* | 10/2009 | Sugino | H01L 23/3128 257/E23.116 |
| 2009/0250823 | A1* | 10/2009 | Racz | H01L 23/31 257/E23.116 |
| 2009/0278126 | A1* | 11/2009 | Yang | H01L 27/124 257/E23.142 |
| 2010/0013081 | A1* | 1/2010 | Toh | H01L 23/481 438/110 |
| 2010/0062287 | A1* | 3/2010 | Beresford | B24B 37/042 451/36 |
| 2010/0078805 | A1* | 4/2010 | Li | H01L 23/49822 257/E23.168 |
| 2010/0144101 | A1* | 6/2010 | Chow | H01L 23/49816 257/E21.502 |
| 2010/0148305 | A1* | 6/2010 | Yun | H01L 23/5223 257/532 |
| 2010/0160170 | A1* | 6/2010 | Horimoto | B24B 7/13 451/28 |
| 2010/0237499 | A1* | 9/2010 | Kim | H01L 24/16 257/784 |
| 2010/0307798 | A1* | 12/2010 | Izadian | H01L 25/50 174/255 |
| 2011/0062594 | A1* | 3/2011 | Maekawa | H01L 24/73 257/E21.597 |
| 2011/0097432 | A1* | 4/2011 | Yu | B29C 45/2606 425/116 |
| 2011/0111300 | A1* | 5/2011 | DelHagen | H01M 4/134 427/78 |
| 2011/0204505 | A1* | 8/2011 | Pagaila | H01L 23/49816 438/109 |
| 2011/0291293 | A1* | 12/2011 | Tuominen | H01L 23/5389 257/774 |
| 2011/0316147 | A1* | 12/2011 | Shih | H01L 23/147 257/737 |
| 2012/0135608 | A1* | 5/2012 | Shimoi | B23K 26/064 438/705 |
| 2012/0146209 | A1* | 6/2012 | Hu | H01L 24/19 257/692 |
| 2012/0164827 | A1* | 6/2012 | Rajagopalan | H01L 21/67109 438/667 |
| 2012/0168206 | A1* | 7/2012 | Sekine | H01L 23/49827 174/266 |
| 2013/0105329 | A1* | 5/2013 | Matejat | H05K 3/4007 205/125 |
| 2013/0183836 | A1* | 7/2013 | Kim | H01L 33/486 438/795 |
| 2013/0200528 | A1* | 8/2013 | Lin | H01L 24/97 257/774 |
| 2013/0286615 | A1* | 10/2013 | Inagaki | H01L 25/162 361/767 |
| 2014/0054075 | A1* | 2/2014 | Hu | H05K 3/4007 29/853 |
| 2014/0094094 | A1* | 4/2014 | Rizzuto | B24B 7/17 451/41 |
| 2014/0103499 | A1* | 4/2014 | Andry | H01L 29/00 257/644 |
| 2014/0252655 | A1* | 9/2014 | Tran | H01L 23/13 257/777 |
| 2015/0228416 | A1* | 8/2015 | Hurwitz | H01G 4/1209 174/257 |
| 2015/0296610 | A1* | 10/2015 | Daghighian | G02B 6/42 385/27 |
| 2015/0311093 | A1* | 10/2015 | Li | H01L 21/02074 438/693 |
| 2015/0359098 | A1* | 12/2015 | Ock | H05K 1/115 29/842 |
| 2015/0380356 | A1* | 12/2015 | Chauhan | H01L 23/367 257/774 |
| 2016/0020163 | A1* | 1/2016 | Shimizu | H05K 1/115 361/768 |
| 2016/0049371 | A1* | 2/2016 | Lee | H01L 24/13 257/621 |
| 2016/0095203 | A1* | 3/2016 | Min | H05K 1/0207 361/690 |
| 2016/0270242 | A1* | 9/2016 | Kim | H05K 1/0353 |
| 2016/0336296 | A1* | 11/2016 | Jeong | H01L 23/49827 |
| 2016/0343972 | A1* | 11/2016 | Trummer-Sailer | H01L 51/529 |
| 2017/0223842 | A1* | 8/2017 | Chujo | H05K 3/4679 |
| 2017/0229432 | A1* | 8/2017 | Lin | H01L 25/105 |
| 2018/0116057 | A1* | 4/2018 | Kajihara | H05K 3/0032 |
| 2018/0182727 | A1* | 6/2018 | Yu | H01L 24/20 |
| 2018/0308792 | A1* | 10/2018 | Raghunathan | B23K 26/0626 |
| 2018/0352658 | A1* | 12/2018 | Yang | H01L 24/25 |
| 2018/0376589 | A1* | 12/2018 | Harazono | H05K 1/115 |
| 2019/0006331 | A1* | 1/2019 | Khalaf | H01L 25/50 |
| 2019/0131224 | A1* | 5/2019 | Choi | H01L 24/20 |
| 2019/0131270 | A1* | 5/2019 | Lee | H01L 24/19 |
| 2019/0189561 | A1* | 6/2019 | Rusli | H01L 23/5226 |
| 2019/0198445 | A1* | 6/2019 | Alur | H01L 23/5385 |
| 2019/0237430 | A1* | 8/2019 | England | H01L 24/89 |
| 2019/0285981 | A1* | 9/2019 | Cunningham | G03F 7/0002 |
| 2019/0326224 | A1* | 10/2019 | Aoki | H01L 23/5383 |
| 2019/0355680 | A1* | 11/2019 | Chuang | H01L 23/5389 |
| 2019/0369321 | A1* | 12/2019 | Young | G02B 6/0065 |
| 2020/0003936 | A1* | 1/2020 | Fu | G03F 7/0002 |
| 2020/0130131 | A1* | 4/2020 | Togawa | B24B 37/015 |
| 2020/0179979 | A1* | 6/2020 | Jin | H01L 41/0831 |
| 2020/0235716 | A1* | 7/2020 | Eid | H01L 23/66 |
| 2020/0357947 | A1* | 11/2020 | Chen | H01L 21/0275 |
| 2021/0234060 | A1* | 7/2021 | Chen | H01L 23/49827 |

FOREIGN PATENT DOCUMENTS

| | | |
|---|---|---|
| JP | 2013207006 A | 10/2013 |
| JP | 2015070007 A | 4/2015 |
| JP | 201692107 A | 5/2016 |
| JP | 2018195620 A | 12/2018 |
| JP | 2019512168 A | 5/2019 |
| WO | 2014186538 A | 11/2014 |

OTHER PUBLICATIONS

Korean Office Action dated Mar. 10, 2023, for Korean Patent Application No. 10-2021-7040360.

Korean Office Action dated Mar. 10, 2023, for Korean Patent Application No. 10-2021-7040365.

* cited by examiner

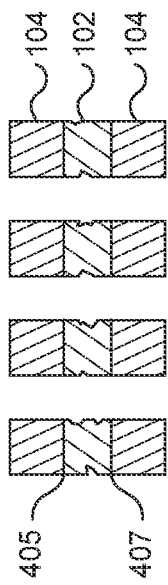
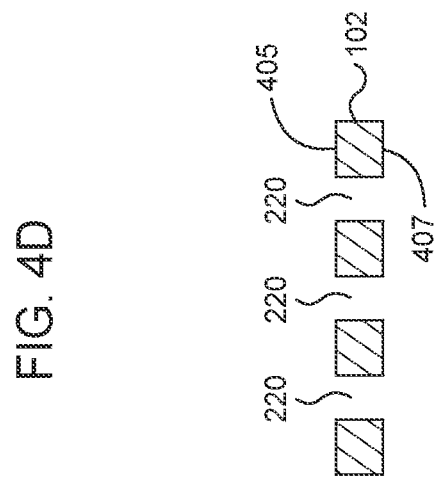
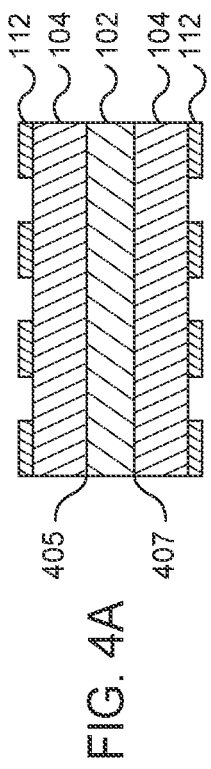
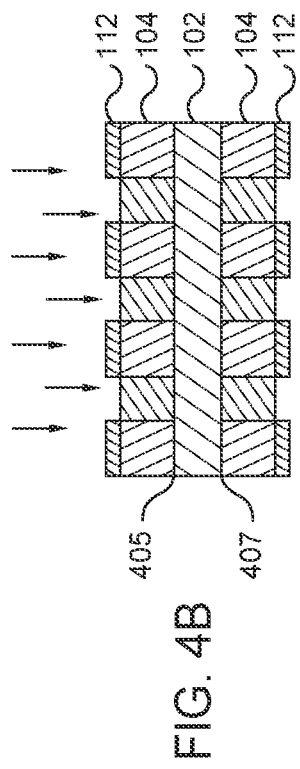
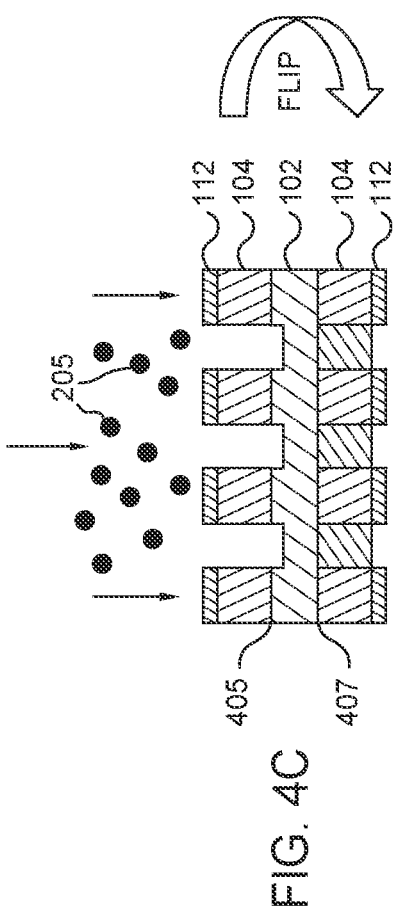

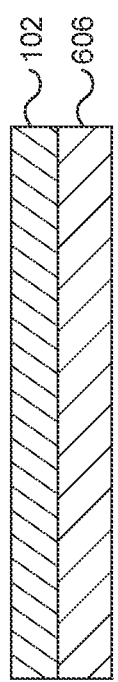
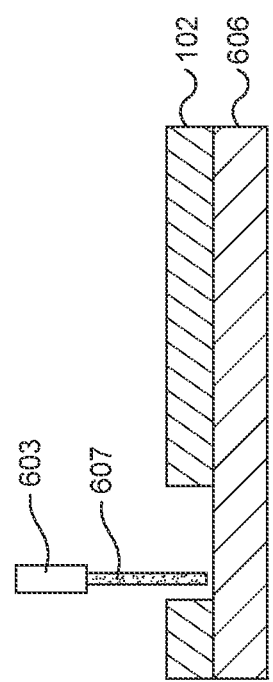
FIG. 6A
FIG. 6B
FIG. 6C
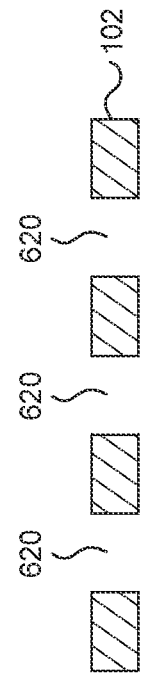
FIG. 6D

SUBSTRATE STRUCTURING METHODS

CROSS-REFERENCE TO RELATED APPLICATIONS

This application is a continuation of U.S. patent application Ser. No. 17/227,763, filed Apr. 12, 2021, which is a continuation of U.S. patent application Ser. No. 16/687,564 filed Nov. 18, 2019, which claims priority to Italian patent application number 102019000006740, filed May 10, 2019, each of which is herein incorporated by reference in its entirety.

BACKGROUND

Field

Embodiments of the present disclosure generally relate to methods and apparatus for structuring semiconductor substrates. More specifically, embodiments described herein relate to methods and apparatus for structuring semiconductor substrates using micro-blasting and laser ablation techniques.

Description of the Related Art

Due to an ever-increasing demand for miniaturized electronic devices and components, integrated circuits have evolved into complex 2.5D and 3D devices that can include millions of transistors, capacitors, and resistors on a single chip. The evolution of chip design has resulted in greater circuit density to improve the process capability and speed of integrated circuits. The demand for faster processing capabilities with greater circuit densities imposes corresponding demands on the materials, structures, and processes used in the fabrication of such integrated circuit chips. Alongside these trends toward greater integration and performance, however, there exists the constant pursuit for reduced manufacturing costs.

Conventionally, integrated circuit chips have been fabricated on organic package substrates due to the ease of forming features and connections therethrough, as well as the relatively low package manufacturing costs associated with organic composites. However, as circuit densities are increased and electronic devices are further miniaturized, the utilization of organic package substrates becomes impractical due to limitations with material structuring resolution to sustain device scaling and associated performance requirements. More recently, 2.5D and 3D integrated circuits have been fabricated utilizing passive silicon interposers placed on organic package substrates as redistribution layers to compensate for some of the limitations associated with organic package substrates. Silicon interposer utilization is driven by the potential for high-bandwidth density, lower-power chip-to-chip communication, and heterogeneous integration requirements in advanced packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved methods of substrate structuring for advanced packaging applications.

SUMMARY

In one embodiment, a method for substrate structuring is provided. The method includes bonding a substrate to a carrier plate with a first adhesive layer, bonding a resist layer on the substrate with a second adhesive layer, and patterning the resist layer with electromagnetic radiation. The method further includes propelling powder particles against the patterned resist layer to form structured patterns in the substrate and exposing the substrate to an etch process to remove debris from the structured patterns and smoothen one or more surfaces thereof. The resist layer is de-bonded from the substrate by releasing the second adhesive layer and the substrate is de-bonded from the carrier plate by releasing the first adhesive layer.

In one embodiment, a method for substrate structuring is provided. The method includes forming a resist layer on a silicon solar substrate, patterning the resist layer by exposing the resist layer to electromagnetic radiation, propelling a stream of powder particles under high pressure towards the substrate to dislodge and remove material from the substrate and form structured patterns therein, and exposing the substrate to an etch process to remove debris from the structured patterns and smoothen one or more surfaces of the substrate.

In one embodiment, a method for substrate structuring is provided. The method includes bonding a first resist layer on a first surface of a substrate with a first adhesive layer, bonding a second resist layer on a second surface of the substrate with a second adhesive layer, and patterning the first resist layer and the second resist layer. The method further includes propelling powder particles towards the first surface of the substrate to form one or more patterned structures therein, propelling powder particles towards the second surface of the substrate to extend the one or more patterned structures across a thickness of the substrate between the first surface and the second surface, and exposing the substrate to an etch process to remove debris from the substrate and smoothen one or more surfaces thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 4-4E schematically illustrate cross-sectional views of a substrate at different stages of a substrate structuring process according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for structuring a semiconductor substrate. In one embodiment, a method of substrate structuring includes applying a resist layer to a substrate optionally disposed on a carrier plate. The resist layer is patterned using ultraviolet radiation or laser ablation. The patterned portions of the resist layer are then transferred onto the substrate by micro-blasting while unexposed or un-ablated portions of the resist layer shield the remainder of the substrate. The substrate is then exposed to an etch process and a de-bonding process to remove the resist layer and release the carrier. In another embodiment, desired features are formed in the substrate by laser ablation.

Figure 1:
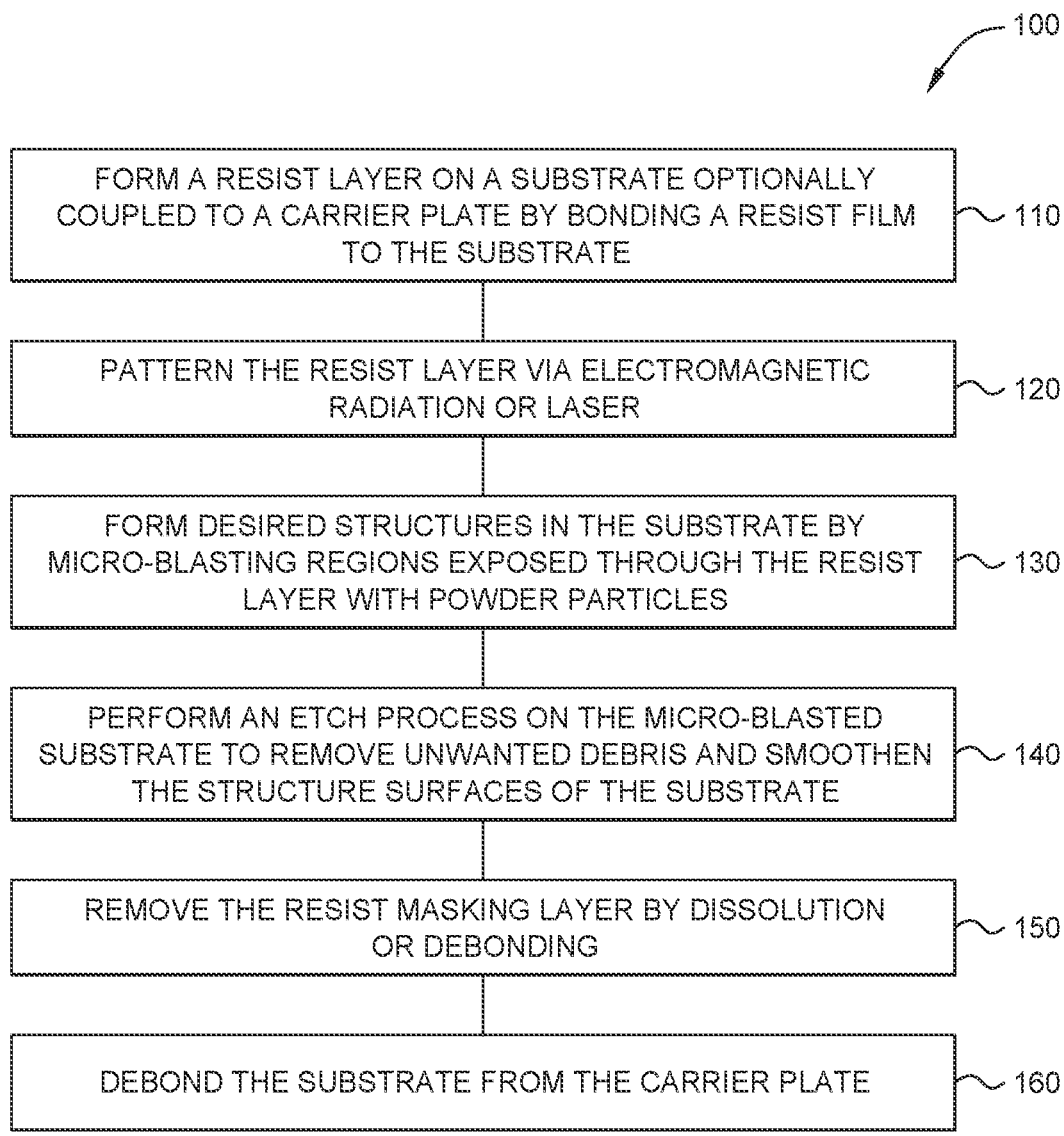
FIG. 1 illustrates a flow diagram of a substrate structuring process according to an embodiment described herein.

FIG. 1 illustrates a flow diagram of a representative method 100 for structuring a substrate 102. FIGS. 2A-2F and 3A-3F illustrate schematic, cross-sectional views of the substrate 102 at different stages of the structuring process of FIG. 1. Thus, reference to FIGS. 2A-2F and 3A-3F will be included in the discussion of FIG. 1 and the method 100 where warranted. Further, the method 100 for structuring the substrate 102 has multiple operations. The operations can be carried out in any order or simultaneously (except where the context excludes the possibility), and the method can include one or more other operations which are carried out before any of the defined operations, between two of the defined operations, or after all the defined operations (except where the context excludes the possibility).

In general, the method 100 includes applying a resist film to the substrate 102 at operation 110. In some embodiments, the substrate 102 is optionally coupled to a carrier plate prior to application of the resist film. At operation 120, the method 100 includes exposing the substrate 102 to electromagnetic or laser radiation to pattern the resist film. At operation 130, the substrate 102 is micro-blasted to form structures, such as blind vias, through vias, or cavities, in the substrate 102. The method further includes etching the substrate 102 to remove debris and surface micro-cracks formed during the micro-blasting process at operation 140, while the patterned resist film remains intact. Subsequently, the patterned resist layer is removed at operation 150, after which the substrate may be further exposed to a carrier plate de-bonding process at operation 160.

The substrate 102 is formed of any suitable substrate material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, borosilicate glass, glass, sapphire, alumina, and ceramic. In one embodiment, the substrate 102 is a packaging substrate. In one embodiment, the substrate 102 is a monocrystalline p-type or n-type silicon substrate. In one embodiment, the substrate 102 is a polycrystalline p-type or n-type silicon substrate. In another embodiment, the substrate 102 is a p-type or n-type silicon solar substrate. Unless otherwise noted, embodiments and examples described herein are performed with substrates having a thickness of between about 50 µm and about 1000 µm, such as between about 90 µm and about 780 µm. For example, the substrate 102 has a thickness of between about 100 µm and about 300 µm, such as a thickness of between about 110 µm and about 200 µm.

In embodiments where the substrate 102 has a thickness of less than about 200 µm, such as a thickness of about 50 µm, the substrate 102 is coupled to a carrier plate 106 during the substrate structuring process 100. The carrier plate 106 provides mechanical support for the substrate 102 during the substrate structuring process 100 and prevents the substrate 102 from breaking. The carrier plate 106 is formed of any suitable chemically and thermally stable rigid material including but not limited to glass, ceramic, metal, and the like. The carrier plate 106 has a thickness between about 1 mm and about 10 mm, such as a thickness between about 2 mm and about 5 mm. In one embodiment, the carrier plate 106 has a textured surface onto which the substrate 102 is coupled. In another embodiment, the carrier plate 106 has a polished surface onto which the substrate 102 is coupled.

In one embodiment, the substrate 102 is coupled to the carrier plate 106 via an adhesive layer 108. The adhesive layer 108 is formed of any suitable temporary bonding material including but not limited to wax, glue, and similar adhesives. The adhesive layer 108 may be applied onto the carrier plate 106 by mechanical rolling, pressing, lamination, spin coating, doctor-blading, or the like. In one embodiment, the adhesive layer 108 is a water- or solvent-soluble adhesive layer. In other embodiments, the adhesive layer 108 is a UV release adhesive layer. In still other embodiments, the adhesive layer 108 is a thermal release adhesive layer. In such embodiments, the bonding properties of the adhesive layer 108 degrade upon exposure to elevated temperatures, such as exposure to temperatures above 110° C., for example, temperatures above 150° C. The adhesive layer 108 may further include one or more layers of films (not shown) such as a liner, a thermal release adhesive film, a base film, a pressure-sensitive film, and other suitable layers.

Figure 2A:
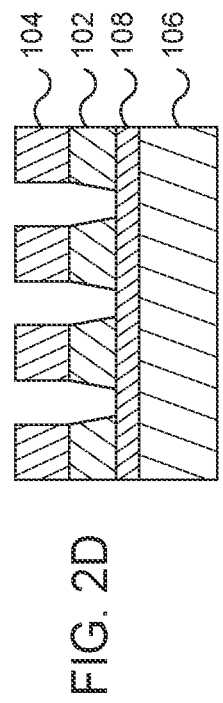
FIGS. 2-2F schematically illustrate cross-sectional views of a substrate at different stages of a substrate structuring process according to an embodiment described herein.
Figure 3A:
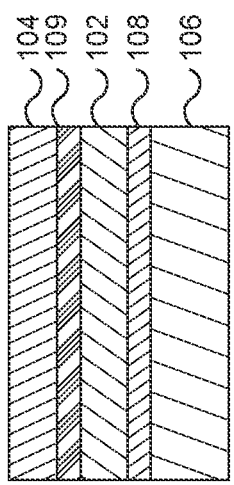
FIGS. 3-3F schematically illustrate cross-sectional views of a substrate at different stages of a substrate structuring process according to an embodiment described herein.

At operation 110, corresponding to FIGS. 2A and 3A, a resist film is applied to the substrate 102 to form a resist layer 104. The resist layer 104 is used to transfer a desired pattern to the substrate 102 during subsequent processing operations. After being patterned at operation 120, the resist layer 104 protects selected regions of the underlying substrate 102 during the micro-blasting process at operation 130.

The substrate 102 has one or more substantially planar surfaces upon which the resist layer 104 may be formed. In one embodiment, such as the embodiment illustrated in FIG. 3A, the resist layer 104 is bonded to the substrate 102 via a resist adhesive layer 109. The resist adhesive layer 109 is formed from any suitable temporary bonding material, including but not limited to polyvinyl alcohol, triester with 2-ethyl-2-(hydroxymethyl)-1,3-propanediol, and other water- or solvent-soluble materials. In one embodiment, the resist adhesive layer 109 is formed from a different material than the adhesive layer 108. In one embodiment, the resist adhesive layer 109 is substantially similar in composition to the adhesive layer 108. The resist adhesive layer 109 may be applied onto the substrate 102 by mechanical rolling, pressing, lamination, spin coating, doctor-blading, or similar processes. In another embodiment, such as the one illustrated in FIG. 2A, the resist layer 104 is formed of a temporary bonding material such as polyvinyl alcohol, thus enabling the resist layer 104 to be directly applied and bonded to the surface of the substrate 102. The resist layer 104 may further include one or more layers, for example, a first resist layer and a second resist layer (not shown).

In one embodiment, such as the embodiment illustrated in FIG. 2A, the resist layer 104 is a photoresist. The resist layer 104 may include a solvent, a photoresist resin, and a photoacid generator. The photoresist resin may be any positive photoresist resin or any negative photoresist resin. Representative photoresist resins include acrylates, novolak resins, poly(methylmethacrylates), and poly(olefin sulfones). Other photoresist resins may also be used. Upon exposure to electromagnetic radiation, the photoacid generator generates charged species, such as acid cations and anions. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

In one embodiment, such as the embodiment illustrated in FIG. 3A, the resist layer 104 is a laser-sensitive resist. The resist layer 104 may be formed of any material having a suitable hardness for laser ablation. For example, the resist layer 104 is formed of a material having a Shore A Scale hardness value of between about 40 and about 90, such as between about 60 and about 70. In one embodiment, the resist layer 104 is formed of a material having a Shore A Scale hardness value of about 65. In further embodiments, the resist layer 404 is formed of a material having a tensile strength of between about 0.5 MPa and about 10 MPa, such as between about 1 MPa and about 8 MPa. For example, the resist layer 104 is formed of a material having a tensile strength of about 7 MPa. In some embodiments, the resist layer 104 is formed of a polydimethylsiloxane material. In other embodiments, the laser-sensitive resist layer 104 is formed of polyvinyl alcohol, triester with 2-ethyl-2-(hydroxymethyl)-1,3-propanediol, or the like.

Figure 2B:
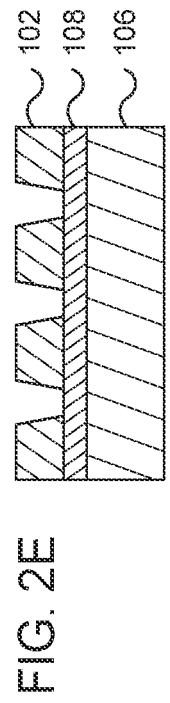
Figure 3B:
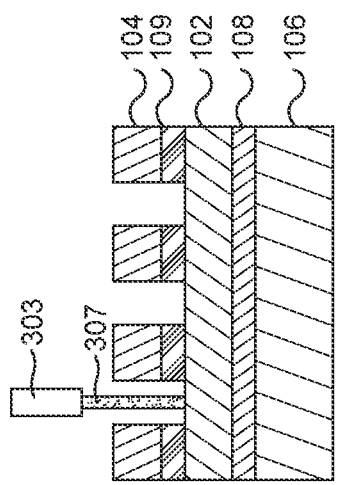

At operation 120, corresponding to FIGS. 2B and 3B, the substrate 102 having the resist layer 104 formed thereon is exposed to electromagnetic radiation to pattern the resist layer 104. In the embodiment illustrated by FIG. 2B, the substrate 102 having the resist layer 404 formed thereon is exposed to electromagnetic radiation in the ultraviolet (UV) range. Portions of the resist layer 104 are selectively exposed and portions of the resist layer 104 are selectively unexposed to the UV radiation. Upon exposure to the UV radiation, the selectively exposed portions of the resist layer 104 are structurally weakened while the selectively unexposed portions maintain their structural integrity, as depicted in FIG. 2B. In one embodiment, a mask 112 having a desired pattern is formed on or adjacent to the resist layer 104 prior to UV radiation exposure. In some embodiments, the mask 112 is a reticle positioned between the resist layer 104 and the UV radiation source. The mask 112 is configured to transfer a desired pattern of UV radiation to the resist layer 104 and is formed of any suitable polymeric materials, including but not limited to PTFE, PVDF, FEP, polyimide, or the like.

In the embodiment illustrated in FIG. 3B, the substrate 102 having a resist layer 104 formed thereon is exposed to electromagnetic radiation generated by a laser source 303 instead of a UV radiation source. As such, patterning is accomplished by targeted laser ablation without the use of a mask. The laser source 303 may be any suitable type of laser source for patterning of the laser-sensitive resist layer 104. In some examples, the laser source 303 is a femtosecond green laser. In other examples, the laser source 303 is a femtosecond UV laser. The laser source 303 generates a continuous or pulsed laser beam for patterning of the resist layer 104. For example, the laser source 303 may generate a pulsed laser beam having a frequency between about 100 kHz and about 1200 kHz, such as between about 200 kHz and about 1000 kHz. It is further contemplated that the electromagnetic radiation at operation 120 may alternatively or additionally include an electron beam or an ion beam in some embodiments.

Figure 2C:
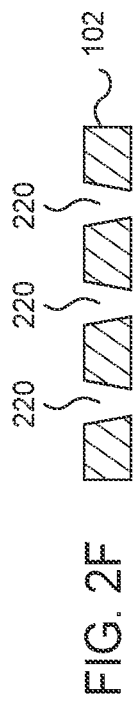
Figure 3C:
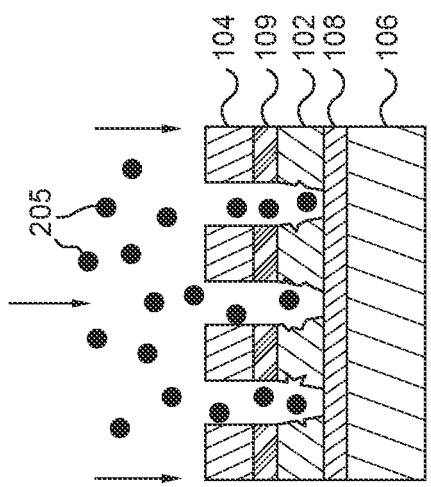

At operation 130, corresponding to FIGS. 2C and 3C, the substrate 102 having the resist layer 104 formed thereon is micro-blasted to form a desired pattern in the substrate 102. During the micro-blasting process, a stream of powder particles 205 is propelled toward the substrate 102 under high pressure to dislodge exposed portions of the substrate 102 and/or layers formed thereon. The micro-blasting process is performed using any suitable substrate abrading system. In one embodiment, the powder particles 205 are propelled using a fluid stream of inert gas, including but not limited to helium, argon, and nitrogen. In another embodiment, the powder particles 205 are propelled using a fluid stream of air.

The micro-blasting process is determined by the material properties of the powder particles 205, the momentum of the powder particles 205 that strike the exposed surface of the substrate 102, as well as the material properties of the substrate 102 along with, when applicable, the selectively-exposed portions of the resist layer 104. To achieve desired substrate patterning characteristics, adjustments are made to the type and size of the powder particles 205, the size and distance of the abrading system's applicator nozzle to the substrate 102, the pressure utilized to propel the powder particles 205, and the density of the powder particles 205 in the fluid stream. For example, a desired fluid pressure of the carrier gas used for propelling the powder particles 205 toward the substrate 102 for a desired fixed micro-blasting device nozzle orifice size may be determined based on the materials of the substrate 102 and the powder particles 205. In one embodiment, the fluid pressure utilized to micro-blast the substrate 102 generally ranges between about 50 psi and about 150 psi, such as between about 75 psi and about 125 psi, to achieve a carrier gas and particle velocity of between about 300 meters per second (m/s) and about 1000 m/s and/or a flow rate of between about 0.001 cubic meters per second (m³/s) and about 0.002 m³/s. For example, the fluid pressure of an inert gas (e.g., nitrogen ($N_2$), CDA, argon) that is utilized to propel the powder particles 205 during micro-blasting is about 95 psi to achieve a carrier gas and particle velocity of about 2350 m/s. In one embodiment, the applicator nozzle utilized to micro-blast the substrate 102 has an inner diameter of between about 0.1 millimeters (mm) and about 2.5 mm that is disposed at a distance between about 1 mm and about 5 mm from the substrate 102, such as between about 2 mm and about 4 mm. For example, the applicator nozzle is disposed at a distance of about 3 mm from the substrate 102 during micro-blasting.

Generally, the micro-blasting process is performed with powder particles 205 having a sufficient hardness and high melting point to prevent particle adhesion upon contact with the substrate 102 and/or any layers formed thereon. For example, the micro-blasting process is performed utilizing powder particles 205 formed of a ceramic material. In one embodiment, the powder particles 205 utilized in the micro-blasting process are formed of aluminum oxide ($Al_2O_3$). In another embodiment, the powder particles 205 are formed of silicon carbide (SiC). Other suitable materials for the powder particles 205 are also contemplated. The powder particles 205 generally range in size between about 15 µm and about 60 µm in diameter, such as between about 20 µm and about 40 µm in diameter. For example, the powder particles 205 are an average particle size of about 27.5 µm in diameter. In another example, the powder particles 205 have an average particle size of about 23 µm in diameter.

The effectiveness of the micro-blasting process at operation 120 further depends on the material characteristics of the resist layer 104. Utilizing a material having too high of a Shore A Scale hardness may cause unwanted ricocheting of the powder particles 205 between sidewalls of the resist layer 104, thus reducing the velocity upon which the powder particles 205 bombard the substrate 102, and ultimately reducing the effectiveness of the powder particles 205 in eroding or dislodging exposed regions of the substrate 102. Conversely, utilizing a material having too low of a Shore A Scale hardness may cause unwanted adhesion of the powder particles 205 to the resist layer 104. It is contemplated that a Shore A Scale hardness value of between about 40 and about 90 is utilized for the resist layer 104 material, as described above.

In embodiments where the resist layer 104 is a photoresist such as depicted in FIG. 2C, the substrate 102 remains unexposed at the start of operation 130. Thus, the powder particles 205 first bombard a surface of the resist layer 104, causing material from the UV-exposed and structurally weakened portions of the photoresist to be dislodged and removed. The powder particles 205 eventually penetrate through and remove the brittle UV-exposed portions to form voids in the resist layer 104, thus exposing desired regions of the substrate 102 while other regions remain shielded by the UV-unexposed portions of the photoresist. Micro-blasting is then continued until the powder particles 205 dislodge and remove a desired amount or depth of material from the exposed regions of the substrate 102, thus forming a desired pattern in the substrate 102.

In embodiments where the resist layer 104 is patterned by laser ablation, such as depicted in FIG. 3C, desired regions of the substrate 102 are already exposed through voids in the resist layer 104 prior to the micro-blasting at operation 130. Thus, minimal or no removal of the resist layer 104 is contemplated at operation 130 during the micro-blasting process. In one embodiment, the micro-blasting process is optional, and laser ablation alone may be utilized to pattern the substrate 102.

Figure 2D:
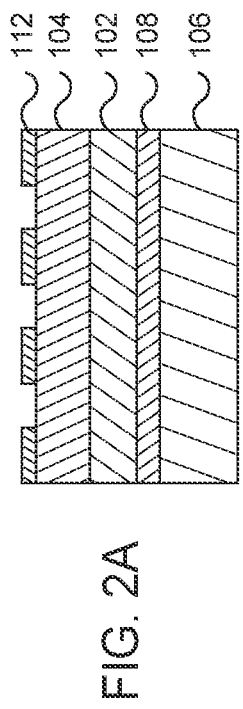
Figure 3D:
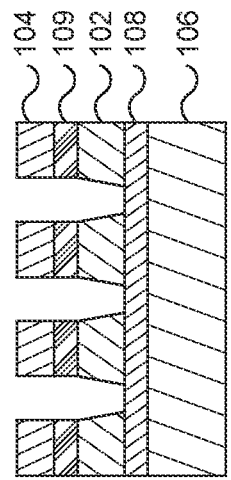

At operation 140, corresponding to FIGS. 2D and 3D, after a desired pattern has been micro-blasted into the substrate 102, the substrate 102 is exposed to an etch process. The etch process at operation 140 is utilized to smoothen the surfaces of the substrate 102 and remove any unwanted mechanical defects thereon. The etch process proceeds for a predetermined duration of time to planarize the surfaces of the substrate 102, and particularly the surfaces exposed to the micro-blasting process at operation 130. In one aspect, the etch process at operation 140 is utilized to remove undesired debris remaining from the micro-blasting process at operation 130. Leftover powder particles 205 adhering to the substrate 102 may be removed during the etch process at operation 140.

In one embodiment, the etch process at operation 140 is a wet etch process utilizing a buffered etch process preferentially etching the substrate surface over the material of the resist layer 104. For example, the buffered etch process may be selective for polyvinyl alcohol. In one embodiment, the etch process is a wet etch process utilizing an aqueous etch process. Any suitable wet etchant or combination of wet etchants may be used for the wet etch process. In one embodiment, the substrate 102 is immersed in an aqueous HF etching solution for etching. In other embodiments, the substrate 102 is immersed in an aqueous KOH etching solution for etching. In one embodiment, the etching solution is heated to a temperature between about 40° C. and about 80° C. during the etch process, such as between about 50° C. and about 70° C. For example, the etching solution is heated to a temperature of about 60° C. The etch process may further be isotropic or anisotropic. In one embodiment, the etch process at operation 140 is a dry etch process. An example of a dry etch process includes a plasma-based dry etch process.

Figure 2E:
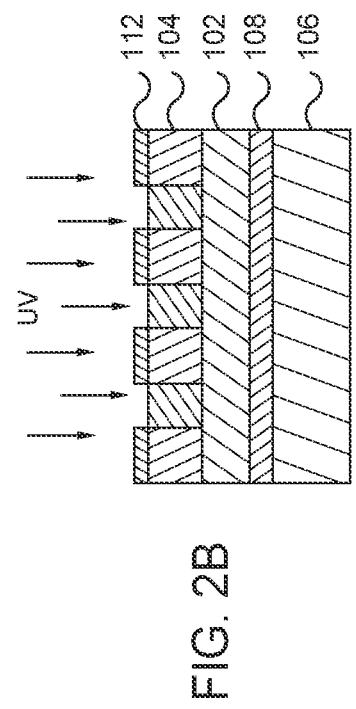
Figure 3E:
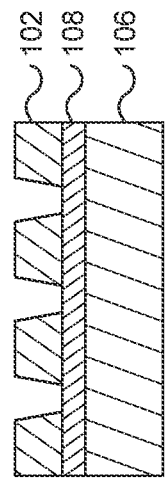

At operation 150, corresponding to FIGS. 2E and 3E, the substrate 102 is exposed to a resist stripping process. The stripping process at operation 150 is utilized to de-bond the resist layer 104 from the substrate 102. In one embodiment, a wet process is used to de-bond the resist layer 104 from the substrate 102 by dissolving/solubilizing the resist adhesive layer 109 and/or the resist layer 104. Other types of etch process are further contemplated for releasing the resist adhesive layer 109 and/or the resist layer 104. In one embodiment, a mechanical rolling process is used to de-bond the resist layer 104 from the substrate 102 by physically peeling off the resist layer 104 or the resist adhesive layer 109. In one embodiment, an ashing process is used to remove the resist layer 104 from the substrate 102 by use of, for example, an oxygen plasma assisted process.

Figure 2F:
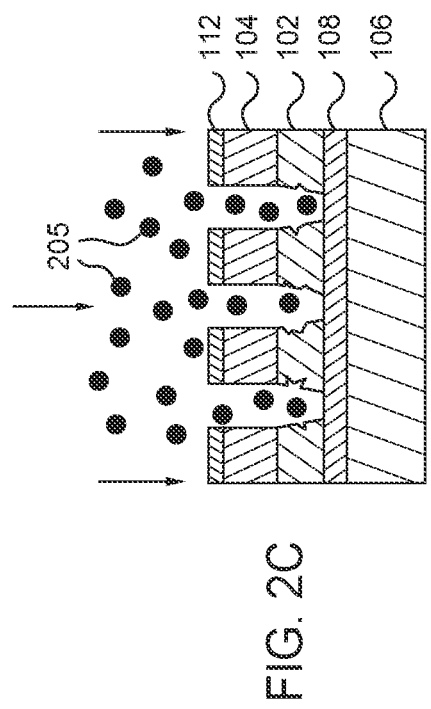
Figure 3F:
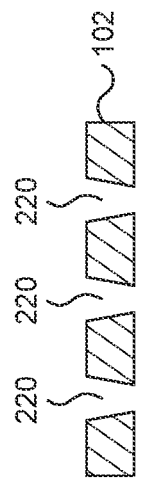

At operation 160, corresponding to FIGS. 2F and 3F, the substrate 102 is exposed to an optional carrier de-bonding process. The utilization of the carrier de-bonding process is dependent on whether the substrate 102 is coupled to the carrier plate 106 and the type of bonding material utilized to couple the substrate 102 thereto. As described above and depicted in FIGS. 2A-2F and 3A-3F, in embodiments where the substrate 102 has a thickness of less than about 200 µm, the substrate is coupled to the carrier plate 106 for mechanical support during the substrate structuring process 100. In some embodiments, the substrate 102 is coupled to the carrier plate 106 via the adhesive layer 108. Thus, at operation 160, the substrate 102 coupled to the carrier plate 106 is exposed to the carrier de-bonding process to de-bond the substrate 102 from the carrier plate 106 by releasing the adhesive layer 108.

In one embodiment, the adhesive layer 108 is released by exposing the substrate 102 to a bake process. In one embodiment, the substrate 102 is exposed to temperatures between about 50° C. and about 300° C., such as temperatures between about 100° C. and about 250° C. For example, the substrate 102 is exposed to a temperature of between about 150° C. and about 200° C., such as about 160° C. for a desired period of time to release the adhesive layer 108. In other embodiments, the adhesive layer 108 is released by exposing the substrate 102 to UV radiation.

FIGS. 2F and 3F illustrate the structured substrate 102 after completion of the method 100. The substrate 102 depicted in FIGS. 2F and 3F has three structures 220 formed therethrough. The method 100 is utilized to form patterned structures 220 in the substrate 102 having various desired depths, dimensions, and shapes. In one embodiment, the structures 220 have a depth equal to the thickness of the substrate 102, thus forming a hole through two opposing surfaces of the substrate 102. In one embodiment, the structures 220 have a depth less than the thickness of the substrate 102, thus forming a hole in only one surface of the substrate 102. For example, a structure 220 formed in the substrate 102 may have a depth of between about 10 µm and about 600 μm, such as a depth of between about 25 μm and about 200 μm, depending upon the thickness of the substrate 102. In one embodiment, the structures 220 have lateral dimensions ranging between about 20 μm and about 15 mm, such as about 50 μm and about 5 mm, depending on the dimensions of the substrate 102. In one embodiment, the structures 220 formed in the substrate 102 have a spheroid or conical shape. In another embodiment, the structures 220 formed in the substrate 102 have a cuboid shape. It is contemplated that the structures 220 formed by the method 100 may have any desired shape, dimensions, and depth as allowed by the substrate 102.

FIGS. 4A-4E illustrate schematic, cross-sectional views of the substrate 102 during an alternative structuring sequence similar to the embodiments described above. The alternative sequence depicted in FIGS. 4A through 4E involves patterning the substrate 102 on two major opposing surfaces as compared to only one surface, thus enabling increased efficiency during structuring of the substrate 102. The substrate structuring sequence depicted in FIGS. 4A-4E includes substantially all of the features and operations as described with reference to FIG. 1, FIGS. 2A-2F, and FIGS. 3A-3F. For example, FIG. 4A corresponds to operation 110 and FIGS. 2A and 3A, FIG. 4B corresponds to operation 120 and FIGS. 2B and 3B, FIG. 4C corresponds to the operation 130 and FIGS. 2C and 3C, FIG. 4D corresponds to the operation 140 and FIGS. 2D and 3D, and FIG. 4E corresponds to the operation 150 and FIGS. 2F and 3F. However, unlike the previous embodiments, the embodiment depicted in FIGS. 4A-4E includes a substrate 102 having two resist layers 104 formed on opposing surfaces 405, 407 thereof, enabling structuring operations to be performed on both surfaces 405, 407.

For example, after exposing the resist layer 104 formed on surface 405 of the substrate 102 to the electromagnetic radiation for patterning at operation 120, the substrate 102 is optionally flipped (e.g., turned over) so that the resist layer 104 on the opposing surface 407 of the substrate 102 may be exposed to the electromagnetic radiation for patterning, as depicted in FIG. 4B. Similarly, after performing the micro-blasting process of operation 130 on surface 405 of the substrate 102, the substrate 102 may be optionally flipped again so that micro-blasting may be performed on the opposing surface 407 of the substrate 102, as depicted in FIG. 4C. By utilizing two resist layers 104 on opposing surfaces 405, 407 of the substrate 102 and performing the micro-blasting process against both surfaces, tapering of structures formed through the entire thickness of the substrate 102 during micro-blasting may also be reduced or eliminated.

Figure 5:
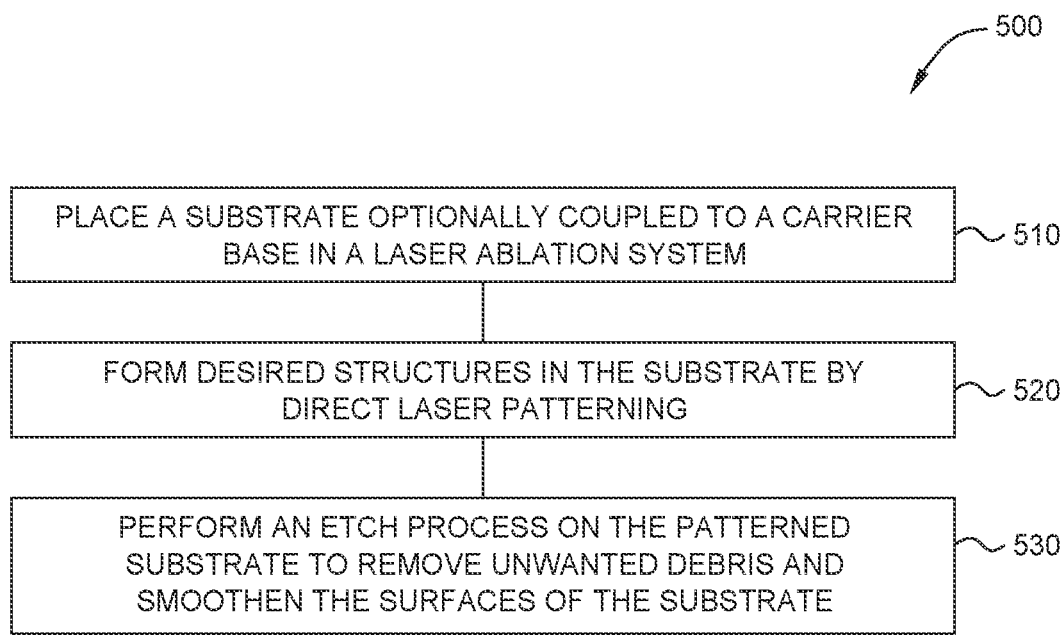
FIG. 5 illustrates a flow diagram of a substrate structuring process according to an embodiment described herein FIGS. 6-6D schematically illustrate cross-sectional views of a substrate at different stages of a substrate structuring process according to an embodiment described herein.

FIG. 5 illustrates a flow diagram of another representative method 500 for structuring the substrate 102. FIGS. 6A-6D illustrate schematic, cross-sectional views of the substrate 102 at different stages of the structuring process of FIG. 5. Thus, reference to FIGS. 6A-6D will be included in the discussion of FIG. 5 and the method 500 where warranted. Similar to the methods described above, the method 500 for structuring the substrate 102 has multiple operations. The operations can be carried out in any order or simultaneously (except where the context excludes the possibility), and the method can include one or more other operations which are carried out before any of the defined operations, between two of the defined operations, or after all the defined operations (except where the context excludes the possibility).

In general, the method 500 includes placing the substrate 102 on a stand 606 of a laser ablation system at operation 510. In some embodiments, the substrate 102 is optionally coupled to a carrier plate prior to placement on the stand 606. At operation 520, the substrate 102 is exposed to laser radiation to pattern the substrate 102 and form desired features therein. At operation 530, the substrate 102 exposed to an etch process to remove debris and surface micro-cracks caused by the laser patterning. In embodiments where the substrate 102 is coupled to a carrier plate, the substrate 102 is further de-bonded from the carrier plate upon performing the etch process.

As depicted in FIG. 6A and corresponding with operation 510, the substrate 102, such as a solar substrate, is placed on a stand 606 of a laser ablation system (not shown). The stand 606 may be any suitable rigid and planar surface for providing mechanical support for the substrate 102 during laser ablation. In some embodiments, the stand 606 includes an electrostatic chuck for electrostatic chucking of the substrate 102 to the stand 606. In some embodiments, the stand 606 includes a vacuum chuck for vacuum chucking of the substrate 102 to the stand 606.

After placing the substrate 102 on the stand 606, a desired pattern is formed in the substrate 102 by laser ablation, depicted in FIG. 6B and corresponding with operation 520. The laser ablation system may include any suitable type of laser source 603 for patterning the substrate 102. In some examples, the laser source 603 is an infrared (IR) laser. In some examples the laser source 603 is a picosecond UV laser. In other examples, the laser source 603 is a femtosecond UV laser. In yet other examples, the laser source 603 is a femtosecond green laser. The laser source 603 generates a continuous or pulsed laser beam 607 for patterning of the substrate 102. For example, the laser source 603 may generate a pulsed laser beam 607 having a frequency between 100 kHz and 1200 kHz, such as between 200 kHz and about 1000 kHz. The laser source 603 is configured to form any desired pattern and features in the substrate 102, including cavities and vias.

Similar to micro-blasting, the process of direct laser patterning of the substrate 102 may cause unwanted mechanical defects on the surfaces of the substrate 102, including chipping and cracking. Thus, after forming desired features in the substrate 102 by direct laser patterning, the substrate 102 is exposed to an etch process at operation 530 substantially similar to the etch process described with reference to operation 140 to remove any remaining debris and smoothen the surfaces of the substrate 102. FIGS. 6C-6D illustrate the substrate 102 before and after performing the etch process, which concludes with the structured substrate 102 having three features 620 (e.g., vias) formed therein.

The embodiments described herein advantageously provide improved methods of substrate structuring for advanced integrated circuit packaging. By utilizing the methods described above, high aspect ratio features may be formed on glass and/or silicon substrates with substantially reduced manufacturing costs, which can be utilized as an economical alternative to silicon interposers.

While the foregoing is directed to embodiments of the present disclosure, other and further embodiments of the disclosure may be devised without departing from the basic scope thereof, and the scope thereof is determined by the claims that follow.

What is claimed is:

1. A method for substrate structuring, comprising:
   bonding a silicon substrate to a carrier plate via an adhesive, the substrate having a thickness between 110 μm and 300 μm, the adhesive comprising at least one of a water-soluble adhesive layer, a solvent-soluble adhesive layer, a thermal release adhesive layer, or a UV release adhesive layer;

chucking the carrier plate and the silicon substrate on a support stand;

patterning the substrate to form one or more cavities and one or more vias therein, the one or more cavities and the one or more vias having different morphologies; and exposing the substrate to an etch process to remove debris from the one or more cavities and the one or more vias, the etch process further smoothening one or more surfaces of the substrate.

2. The method of claim 1, wherein the substrate is patterned via laser ablation.

3. The method of claim 2, wherein the laser ablation is performed using an infrared (IR) laser.

4. The method of claim 2, wherein the laser ablation is performed using an ultraviolet (UV) laser.

5. The method of claim 4, wherein the laser ablation is performed using a picosecond UV laser.

6. The method of claim 4, wherein the laser ablation is performed using a femtosecond UV laser.

7. The method of claim 2, wherein the laser ablation is performed using a green laser.

8. The method of claim 7, wherein the laser ablation is performed using a femtosecond green laser.

9. The method of claim 2, wherein the laser ablation is performed using a pulsed laser beam having a frequency between about 100 kHz and about 1200 kHz.

10. The method of claim 9, wherein the laser ablation is performed using a pulsed laser beam having a frequency between about 200 kHz and about 1000 kHz.

11. The method of claim 2, wherein the laser ablation is performed using a continuous laser beam.

12. The method of claim 1, wherein the etch process is a wet etch process comprising an aqueous HF etching solution or an aqueous KOH etching solution.

13. The method of claim 1, wherein the etch process is a plasma-based dry etch process.

14. A method for substrate structuring, comprising:
bonding a silicon substrate to a carrier plate via an adhesive, the substrate having a thickness between 110 µm and 300 µm, the adhesive comprising at least one of a water-soluble adhesive layer, a solvent-soluble adhesive layer, a thermal release adhesive layer, or a UV release adhesive layer;

chucking the carrier plate and the silicon substrate on a support stand;

laser patterning the substrate to form a plurality of structures in the substrate, the plurality of structures comprising one or more cuboid structures and one or more conical structures;

exposing the substrate to an etch process to remove debris from the plurality of structures, the etch process further smoothening one or more surfaces of the substrate; and de-bonding the substrate from the carrier plate by releasing the adhesive.

15. The method of claim 14, wherein the laser patterning is performed using an infrared (IR) laser.

16. The method of claim 15, wherein the laser patterning is performed using an ultraviolet (UV) laser.

17. The method of claim 14, wherein the laser patterning is performed using a pulsed laser beam having a frequency between about 100 kHz and about 1200 kHz.

18. The method of claim 14, wherein the laser patterning is performed using a continuous laser beam.

19. A method for substrate structuring, comprising:
bonding a silicon substrate to a carrier plate via an adhesive, the substrate having a thickness between 110 µm and 300 µm, the adhesive comprising at least one of a water-soluble adhesive layer, a solvent-soluble adhesive layer, a thermal release adhesive layer, or a UV release adhesive layer;

vacuum chucking the carrier plate and the silicon substrate on a support stand;

laser patterning the substrate to form a plurality of structures in the substrate, the plurality of structures comprising one or more cuboid structures and one or more conical structures;

exposing the substrate to a wet etch process to remove debris from the plurality of structures, the etch process further smoothening one or more surfaces of the substrate; and de-bonding the substrate from the carrier plate.

20. The method of claim 19, wherein the laser patterning is performed using an infrared (IR) or ultraviolet (UV) laser.

* * * * *